(12) United States Patent
Issakov et al.

(10) Patent No.: US 10,367,452 B2
(45) Date of Patent: Jul. 30, 2019

(54) SYSTEM AND METHOD FOR A DUAL-CORE VCO

(71) Applicant: Infineon Technologies AG, Neubiberg (DE)

(72) Inventors: Vadim Issakov, Munich (DE); Fabio Padovan, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 194 days.

(21) Appl. No.: 15/461,203

(22) Filed: Mar. 16, 2017

(65) Prior Publication Data

US 2018/0269833 A1 Sep. 20, 2018

(51) Int. Cl.
*H03B 5/12* (2006.01)

(52) U.S. Cl.
CPC ......... *H03B 5/1231* (2013.01); *H03B 5/1243* (2013.01); *H03B 5/1293* (2013.01); *H03B 5/1296* (2013.01); *H03B 2200/004* (2013.01); *H03B 2200/0008* (2013.01); *H03B 2200/009* (2013.01)

(58) Field of Classification Search
CPC ............................. H03B 5/1231; H03B 5/1296
See application file for complete search history.

(56) References Cited

U.S. PATENT DOCUMENTS 6,639,481 B1* 10/2003 Ravi .................... H03L 7/00
331/177 V
2017/0346443 A1* 11/2017 Chataigner .......... H03B 5/1231

OTHER PUBLICATIONS

Seyed, A et al., "Analysis and Design of a Multi-Core Oscillator for Ultra-Low Phase Noise," IEEE Transactions on Circuits and Systems—I: Regular Papers, vol. 63, No. 4, Apr. 2016, 11 pages.

* cited by examiner

*Primary Examiner* — Jeffrey M Shin
(74) *Attorney, Agent, or Firm* — Slater Matsil, LLP

(57) ABSTRACT

In accordance with an embodiment, a method of operating a voltage controlled oscillator (VCO) includes generating a first oscillating signal in a first VCO core and generating a second oscillating signal in a second VCO core, such that the first oscillating signal and the second oscillating signal have a same frequency and a fixed phase offset. The VCO includes the first VCO core and the second VCO core, and each VCO core includes a pair of transistors. The VCO also includes a transformer having a first winding coupled between control nodes of the pair of transistors of the first VCO core and a second winding coupled between control nodes of the pair of transistors of the second VCO core.

20 Claims, 15 Drawing Sheets

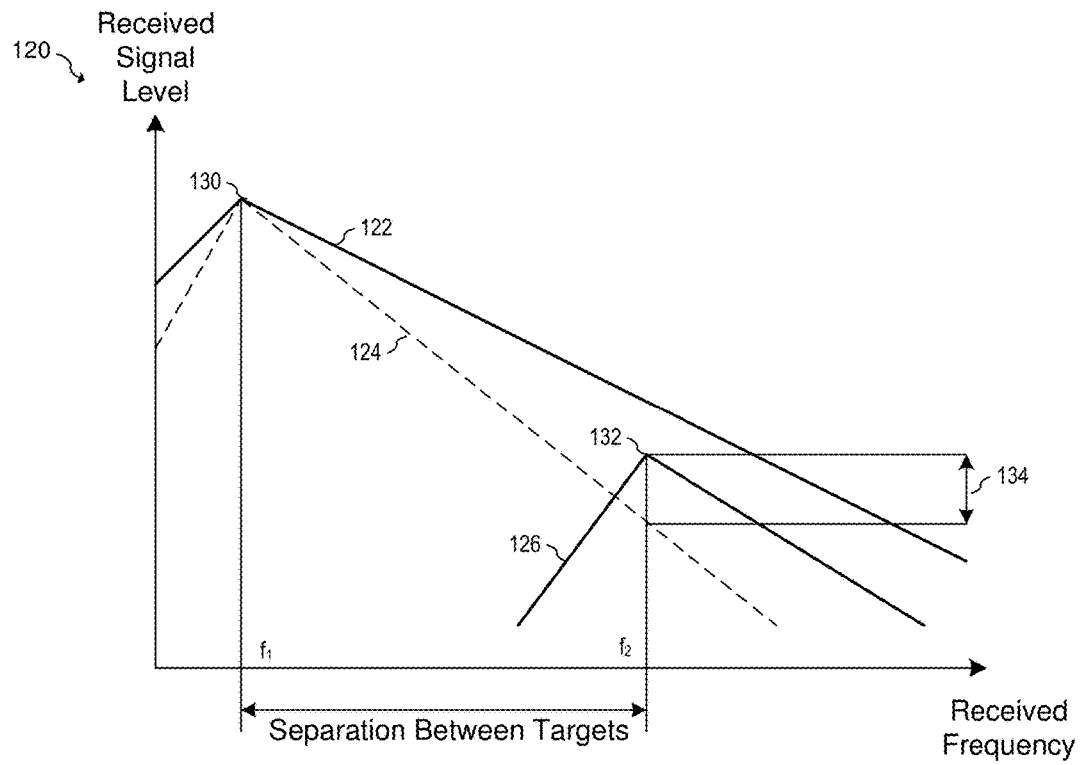
FIG. 1B
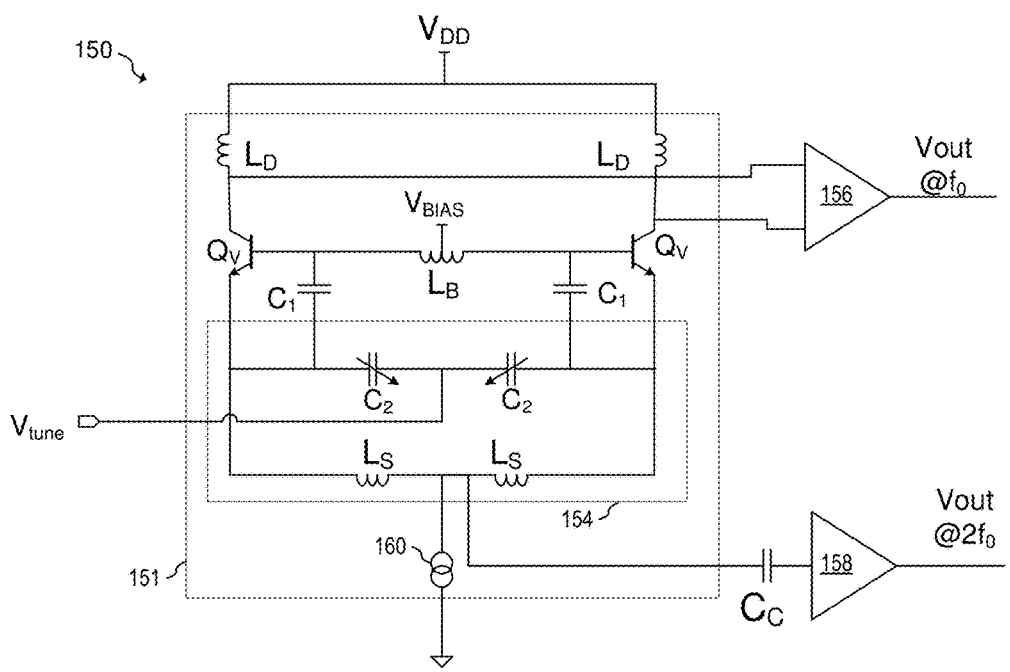
PRIOR ART    FIG. 1C

FIG. 2B     FIG. 2F

SYSTEM AND METHOD FOR A DUAL-CORE VCO

TECHNICAL FIELD

The present invention relates generally to an electronic device, and, in particular embodiments, to a system and method for a dual-core VCO.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Resolution, accuracy and sensitivity of the radar system may depend, in part, on the phase noise performance and frequency agility of the radar's frequency generation circuitry, which generally includes an RF oscillator and circuitry that controls the frequency of the RF oscillator.

As the operating frequencies of RF systems continue to increase, however, the generation of signals at such high frequencies poses a major challenge. Oscillators that operate at high frequencies may suffer from a poor phase noise performance that caused by 1/f and thermal noise in the devices that comprise the VCO.

SUMMARY

In accordance with an embodiment, a method of operating a voltage controlled oscillator (VCO) includes generating a first oscillating signal in a first VCO core and generating a second oscillating signal in a second VCO core, such that the first oscillating signal and the second oscillating signal have a same frequency and a fixed phase offset. The VCO includes the first VCO core and the second VCO core, and each VCO core includes a pair of transistors. The VCO also includes a transformer having a first winding coupled between control nodes of the pair of transistors of the first VCO core and a second winding coupled between control nodes of the pair of transistors of the second VCO core.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A and 1B illustrate the operation of an example automotive radar system;

FIG. 1C illustrates a schematic of a conventional Colpitts VCO;

FIG. 2B illustrates a plan view of an embodiment symmetrical transformer;

FIG. 2F illustrates a varactor circuit;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a voltage controlled oscillator. The invention may be applied to various systems that utilize voltage controlled oscillators such as radar systems, wireless communication systems, and other types of RF systems.

Figure 1A:
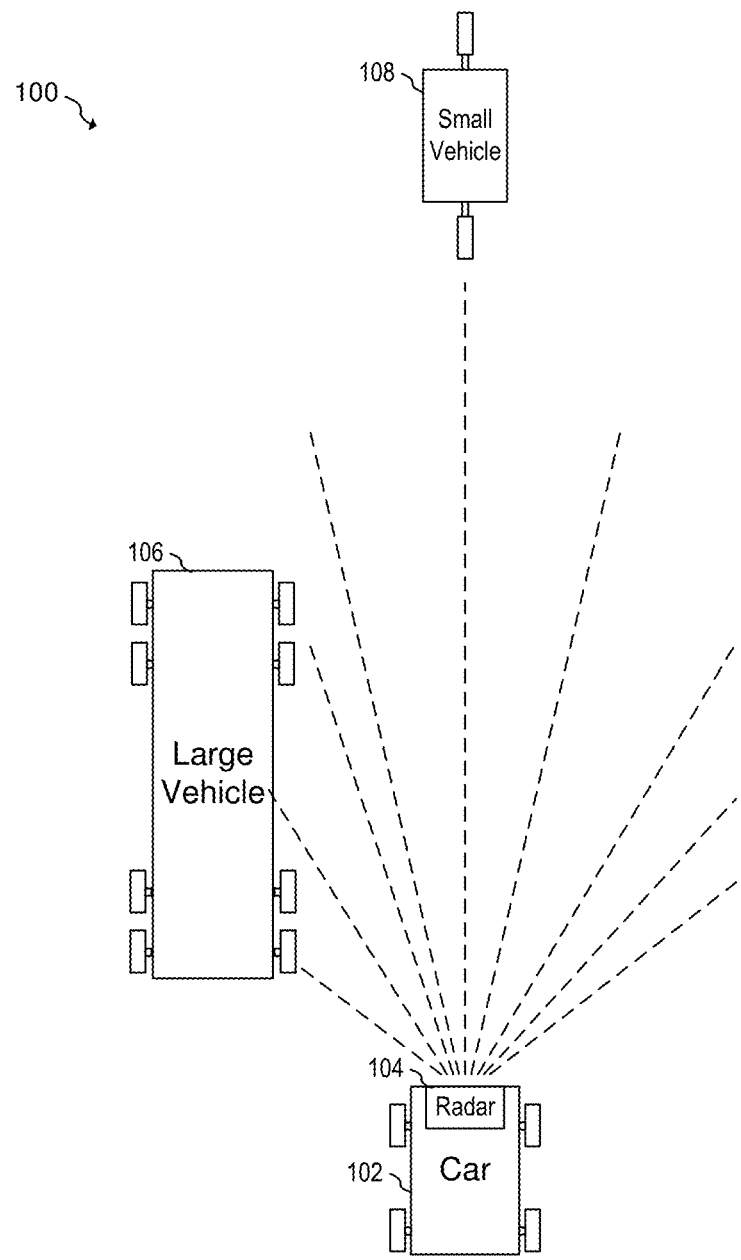

FIG. 1A illustrates an example automotive radar scenario 100 in which automobile 102 includes automotive radar system 104. Automotive radar system 104 transmits and receives, for example, a frequency modulated continuous wave (FMCW) signal, and detects reflections of this transmitted signal in order to determine a distance between automotive radar system 104 and other vehicles or objects on the road. In the illustrated scenario, a large vehicle 106, such as a truck is closer to automobile 102 then a small vehicle 108, such as a motorcycle. Under normal operating conditions, the echo or reflection off large vehicle 106 will be of a higher amplitude then the reflection off small vehicle 108 because large vehicle 106 is both larger and closer than small vehicle 108.

FIG. 1B illustrates a graph 120 of received signal level versus received frequency for the scenario of FIG. 1A. Signal level versus frequency curve 122 corresponds to the received reflection from large vehicle 106 and the frequency f1 of signal level peak 130 corresponds to the distance between automotive radar system 104 and large vehicle 106. Likewise, signal level versus frequency curve 126 corresponds to the received reflection from small vehicle 108 and the frequency F2 of the signal level peak 132 corresponds to the distance between automotive radar system 104 and small vehicle 108. Accordingly, the distance between large vehicle 106 and small vehicle 108 is proportional to the separation between frequencies F1 and F2.

Along with the desired output signal, the phase noise of the radar transmitter is also transmitted and reflected. The phase noise 124 reflected from large vehicle 106 is represented as a dashed line. As seen in graph 120, phase noise 124 affects the ability of the radar to receive signals reflected from small vehicle 108. The signal to noise ratio between signal level peak 132 due to small vehicle 108 and the corresponding noise floor due to phase noise reflected from large vehicle 106 is represented as length 134. It can be seen from the graph of FIG. 1B, that phase noise affects the ability of automotive radar system 104 to discern small and distant objects. The higher the phase noise of the radar transmitter, the less the radar system is able to discern small and distant objects.

FIG. 1C illustrates a conventional VCO 150 according to a Colpitts architecture in a "push-push" configuration that includes VCO core 151 having transistors $Q_V$, a tank 154 that includes tunable capacitors $C_2$ and inductors $L_S$, capacitors $C_1$ load inductors $L_D$, bias inductor $L_B$, and current source 160. During operation, transistors $Q_V$ provide energy to tank 154 which causes the tank to resonate and produces oscillations. Positive feedback from the tank to the base of transistors $Q_V$ via capacitors $C_1$ maintains the oscillations. The frequency of oscillation $f_o$ of VCO 150 is approximately:

$$f_0 = \frac{1}{2\pi\sqrt{L_S C_2}}.$$

The frequency of oscillation $f_o$ of VCO 150 may be tuned or adjusted by changing the capacitance of capacitors $C_2$ and/or the inductance of inductors $L_S$. In implementations in which capacitors $C_2$ are implemented using varactor diodes, the capacitance of capacitors $C_2$ may be adjusted by changing voltage $V_{tune}$.

The fundamental frequency $f_o$ may be buffered using buffer 156 that is connected differentially to load inductors $L_D$. The second harmonic of $2f_o$ may be buffered using buffer 158 that is coupled at a common node between inductors $L_S$ of tank 154 via coupling capacitor $C_C$. Even though tank oscillates at fundamental frequency $f_o$, the second harmonic $2f_o$ is present at the input to buffer 158 due to operation properties of the oscillator. During the first half of an oscillation period, the bias current provided by current source 160 flows through one branch that includes one of the transistors $Q_V$, and during the second half of an oscillation period, the bias current provided by current source 160 flows through the other branch that includes the other one of the transistors $Q_V$. This causes voltage variations of two positive half waves at the common node between inductors $L_S$, which corresponds to a frequency of $2f_o$.

The phase noise of VCO 150 is related to a number of different factors including thermal noise of the devices that make up the RF oscillator, the quality factor or "Q" of the resonant tank 154 and the amplitude of oscillation. According to Leeson phase noise expression, the phase noise of an oscillator can be expressed as:

$$\mathcal{L}(f_c, \Delta f)\left[\frac{dBc}{Hz}\right]_{f_0 \gg \Delta f} = 10\log\left\{\frac{kTFR_s}{V_{sig}^2}\left(\frac{f_0}{\Delta f}\right)^2\right\},$$

Where $\mathcal{L}(f_c, \Delta f)$ is the relative phase noise in dBc/Hz, k is Boltzmann's constant, T is the temperature in Kelvin, F is a device noise excess factor of the oscillator, $R_S$ is the effective tank resistance of inductor $L_S$, $V_{sig}$ is the amplitude of oscillation, $f_o$ is the frequency of and $\Delta f$ is the offset from the carrier at which the phase noise is being evaluated.

As can be seen by Leeson phase noise expression above, the phase noise of the VCO can be reduced by increasing the quality factor Q of the tank (e.g., by decreasing resistance $R_S$) or by increasing the amplitude of oscillation $V_{sig}$. For practical purposes, however, there may be practical limits as to the ability to increase the quality factor Q and the amplitude of oscillation $V_{sig}$. For example, for VCOs that are implemented on an integrated circuit, quality factor Q may be limited according to the particular back-end of line (BEOL) of the particular fabrication process. For example, the sheet resistance of the conductors used to implement inductor $L_S$ may have a minimum value that limits quality factor Q. On the other hand, the amplitude of oscillation $V_{sig}$ may be limited according to the supply voltage $V_{DD}$.

Figure 1D:
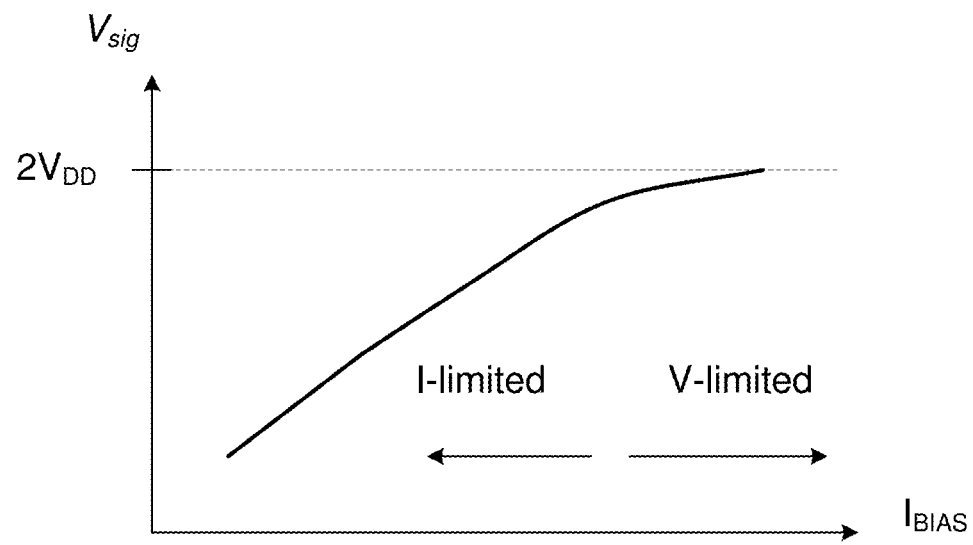
FIG. 1D illustrates a graph of VCO signal amplitude vs. bias current.

FIG. 1D shows a graph that illustrates the relationship between output amplitude $V_{sig}$ and bias current $I_{BIAS}$. For output amplitudes lower than $2V_{DD}$, the amplitude $V_{sig}$ increases according to bias current $I_{BIAS}$. However, when the amplitude $V_{sig}$ approaches $2V_{DD}$ the output amplitude approaches $2V_{DD}$, additional increases in bias current $I_{BIAS}$ provides diminishing returns with respect to increasing amplitude $V_{sig}$. Thus, limitations in quality factor Q and amplitude $V_{sig}$ effectively limits the achievable phase noise performance for a given oscillator.

In embodiments of the present invention, the phase noise performance is improved by coupling two oscillator cores together via a transformer having a first winding coupled between control nodes (e.g., gates or bases) of a transistor pair in the first oscillator core and a second winding coupled between control nodes of a transistor pair in a second oscillator core. Each oscillator core, which has a topology that includes a tank coupled to reference nodes (e.g., sources or emitters) of the transistor pair, may be arranged, for example, in a Colpitts, Clapp, Hartley or cross-coupled topology.

Figure 2A:
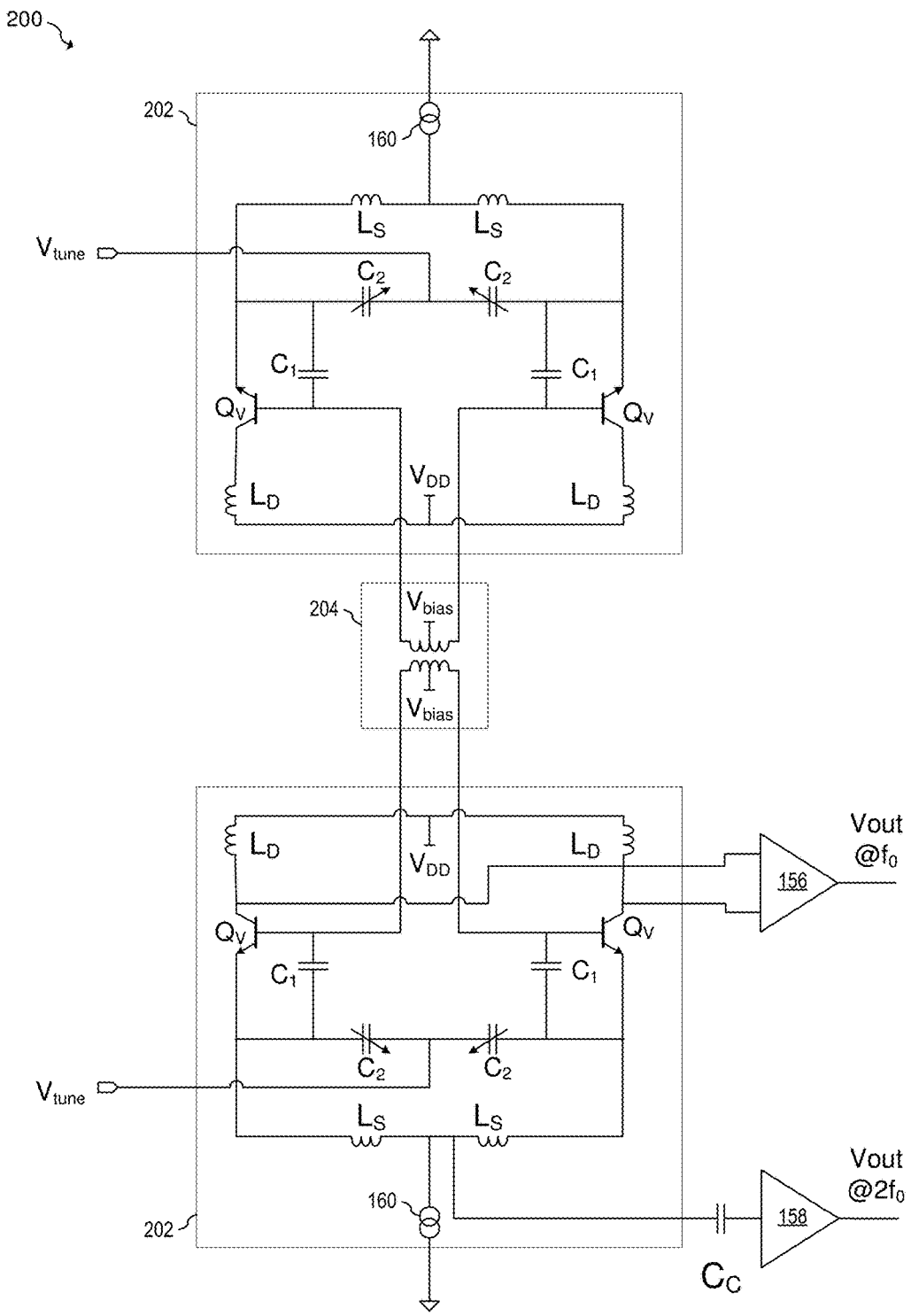
FIG. 2A illustrates a schematic of an embodiment dual-core Colpitts VCO.

FIG. 2A illustrates a VCO 200 according to an embodiment of the present invention. As shown in FIG. 2A, two VCO cores 202 are coupled together via transformer 204. Each of these VCO cores 202 includes bipolar junction transistors (BJTs) $Q_V$ and inductors $L_D$, current source 160 and capacitors $C_1$ as described above. In some embodiments, the tank of each VCO core 202 is a parallel resonant tank having an inductance dominated by the coupled winding of transformer 204 and a capacitance that includes capacitor $C_2$. In various embodiments, inductor $L_S$ is set to have a high ohmic impedance, as well as being inductive at the oscillation frequency $f_o$. In addition, the bias inductors for the bases of transistors $Q_V$ are implemented using the windings of transformer 204 such that each winding of transformer 204 is coupled to the bases of transistors $Q_V$ of a corresponding VCO core 202. The base of bipolar transistor $Q_V$ may also be referred to as a "control node," the emitter of bipolar transistor $Q_V$ may be referred to as a "reference node" and the collector of bipolar transistor $Q_V$ may be referred to as an "output node." Likewise the terminology of "control node," "reference node" and "output node" may be respectively applied to the gate, source and drain of a FET.

A bias voltage $V_{bias}$ is provided to each of the bases of transistors $Q_V$ via the center taps of windings of transformer 204. By coupling the two VCO cores 202 together, the phase and frequency of oscillation of the VCO cores are synchronized by injection locking. As a result, the oscillating signals in each core have a same frequency and can oscillate in-phase or out-of phase with each other, depending on the coupling conditions. As a result, the oscillating signals in each core have a same frequency and a fixed phase offset. In various embodiments, a 3 dB phase noise rejection can be achieved by coupling VCO cores. One way to view the decreased phase noise is to consider that placing two VCO tanks in parallel has the effect of doubling the tank capacitance C and halving the tank inductance L and effective tank resistance $R_S$. This maintains a constant frequency of oscillation because the LC product maintains the same value. Reducing the effective tank resistance $R_S$ by a factor of two, however, results in a 3 dB reduction in phase noise according to Leeson's formula above. Another way to view the decreased phase noise is to consider that the current noise produced each VCO core is reduced by 6 dB due to the doubled capacitance of the coupled VCO tanks. Because the components in each VCO core produces its own noise that is uncorrelated to the other VCO, the noise powers of each VCO core is summed by their powers; thus the total phase noise of the coupled VCO cores is reduced by 3 dB.

The fundamental frequency $f_o$ or oscillation frequency of VCO 200 may be buffered using buffer 156 that is connected differentially to load inductors $L_D$ and the second harmonic of $2f_o$ may be buffered using buffer 158 that is coupled between inductors $L_S$ via coupling capacitor $C_C$ of one of the VCO cores 202. In some embodiments, additional buffers (not shown) and coupling capacitors (not shown) may be coupled to the other VCO core 202 in order to provide symmetric loading. The loading of each VCO core may also be made symmetric by coupling only the devices within buffers 156 and 158 that affect the load seen by the other VCO core. Alternatively, other techniques know in the art may be used to make the loading of each VCO core 202 symmetric.

In various embodiments, the VCO 200 may be configured to oscillate at a frequency of between 1 GHz and 200 GHz depending on the values of the inductance of the coupled winding of transformer 204 and capacitor $C_2$.

In some embodiments, transformer 204 is implemented using a symmetrical transformer in which the electrical characteristics of each winding are closely matched. FIG. 2B shows a layout of an integrated symmetrical transformer 205 that may be used to implement transformer 204. As shown, transformer 205 includes a first winding 210 and a second winding 220 that is symmetrically adjacent to first winding 210 that are disposed, for example, on a substrate 207. In various embodiments, first winding 210 and second winding 220 have closely matched and/or identical geometries. First winding 210 includes winding terminals 212 and 214 on one side of the first winding and a center tap terminal 216 on the other side of the first winding. Likewise, second winding 220 includes winding terminals 222 and 224 on one side of the second winding and a center tap terminal 226 on the other side of the second winding. The two windings are arranged so such that center tap terminal 226 of the second winding is disposed between winding terminals 212 and 214 of the first winding, and center tap terminal 216 of the first winding is disposed between winding terminals 222 and 224 of the second winding.

Each winding has a respective cross-under portion: the first winding crosses under the second winding via cross-under portion 218 and the second winding crosses under the first winding via cross-under portion 228, such that the main portion of the winding is on a first conductive layer, and the cross-under portion is on a second conductive layer. Alternatively, cross-under portions 218 and 228 may cross-over portion. As shown, cross-under portions 218 and 228 are disposed symmetrically opposite each other in the layout of transformer 204. These conductive layers may be metallization layers made of copper, aluminum, or other conductive materials used, for example, in the fabrication of semiconductor circuits. Such metallization layers may be fabricated during the back end of line (BEOL) processing of the semiconductor circuit. Alternatively, the metallization layers may be fabricated on a redistribution layer RDL in a package after the integrated circuit has been fabricated. Substrate 207 may be a semiconductor substrate such as a silicon substrate, or may be another type of substrate including by not limited to an insulating substrate, a ceramic substrate or molded substrate, depending on the particular fabrication technology used. It should be understood that symmetrical transformer 205 is just one of many possible embodiment symmetrical transformers. In alternative embodiments of the present invention, symmetrical transformers may be implemented shapes and sizes that are different from what is illustrated in FIG. 2B.

Figure 2C:
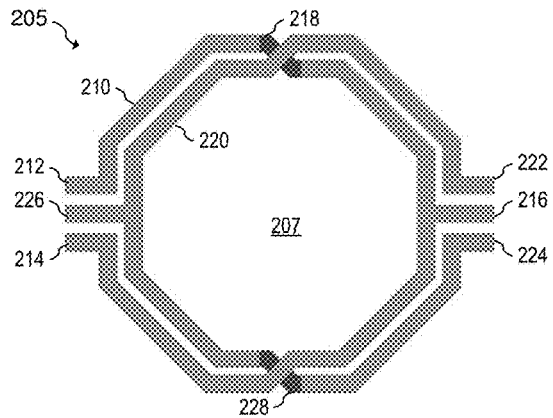
FIGS. 2C, 2D and 2E illustrate graphs of electrical characteristics of the embodiment symmetrical transformer of FIG. 2B.
Figure 2C:
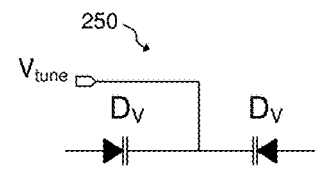
Figure 2C:
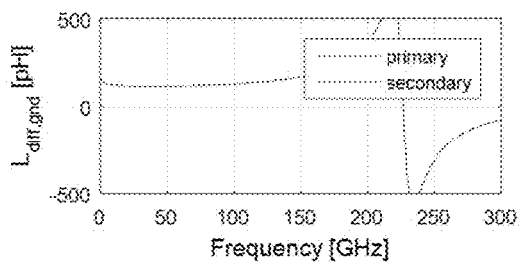
Figure 2C:
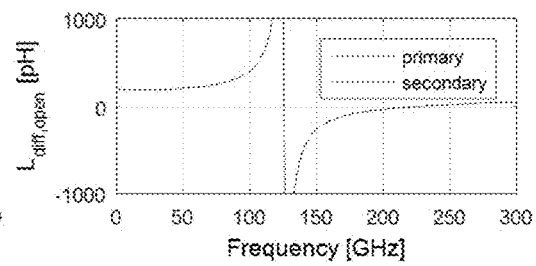
Figure 2D:
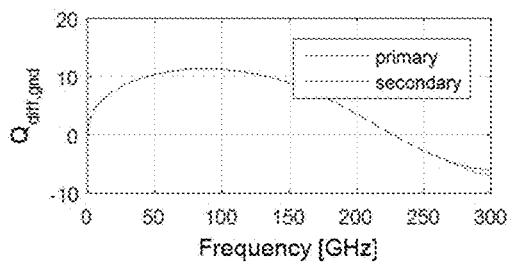
Figure 2D:
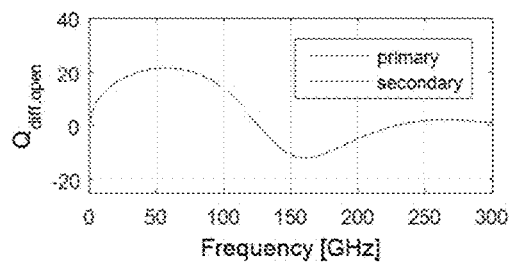
Figure 2E:
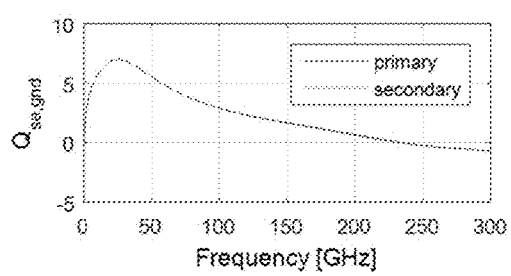
Figure 2E:
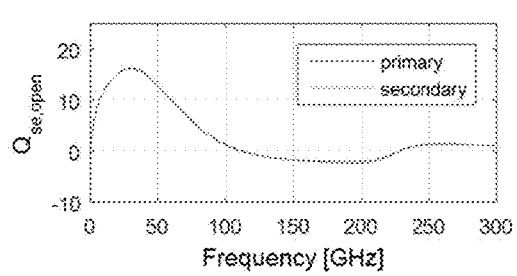

FIGS. 2C, 2D and 2E illustrate graphs of electrical characteristics of embodiment symmetrical transformer 205 illustrated in FIG. 2A. FIG. 2C illustrates plots of differential inductances $L_{diff,gnd}$ and $L_{diff,open}$ with respect to frequency. Differential inductance $L_{diff,gnd}$ is the inductance between the winding terminals of one winding measured while the other winding is grounded. Differential inductance $L_{diff,open}$, on the other hand, is the inductance between the winding terminals of one winding measured while the other winding is open. Each of the graphs of FIG. 2C includes a curve the representing the differential inductance of the primary winding and a curve representing the differential inductance of the secondary winding. As can be seen by the graphs of FIG. 2C, the difference between the two curves is indiscernible, which indicates that the inductances of the first and second winding are symmetric.

FIG. 2D illustrates plots of quality factor $Q_{diff,gnd}$ and $Q_{diff,open}$ with respect to frequency. Quality factor $Q_{diff,gnd}$ is the Q of the differential inductance between the winding terminals of one winding measured while the other winding is grounded, while quality factor $Q_{diff,open}$ is the Q of the differential inductance between the winding terminals of one winding measured while the other winding is open. Each of the graphs of FIG. 2D includes a curve the representing the Q of the differential inductance of the primary winding and a curve representing the Q of the differential inductance of the secondary winding. As can be seen the Qs are closely matched.

Lastly, FIG. 2E illustrates plots of quality factor $Q_{se,gnd}$ and $Q_{se,open}$ with respect to frequency. Quality factor $Q_{se,gnd}$ is the Q of the single-ended inductance between the winding terminals of one winding measured while the other winding is grounded, while quality factor $Q_{se,open}$ is the Q of the single-ended inductance between the winding terminals of one winding measured while the other winding is open. Each of the graphs of FIG. 2E includes a curve the representing the Q of the single-ended inductance of the primary winding and a curve representing the Q of the single-ended inductance of the secondary winding, which indicated that the Qs are closely matched. It should be appreciated that the graphs of FIGS. 2C-2E are just one example of the performance of one embodiment symmetrical transformer. Other embodiment symmetrical transformers may have different electrical characteristics depending on the particular geometry and depending on the particular process in which the symmetrical transformer is fabricated.

FIG. 2F illustrates an embodiment varactor circuit 250 that may be used to implement tunable capacitances, such as capacitor $C_2$ of the various disclosed embodiment VCOs. As shown, varactor circuit 250 includes a pair of series connected varactor diodes $D_V$. In various embodiments, the capacitance of varactor diodes $D_V$ may be adjusted by varying the voltage of $V_{tune}$ applied to the cathodes of varactor diodes $D_V$. As the voltage $V_{tune}$ is increased, the capacitance of varactor diodes $D_V$ decreases due to the increased width of the depletion regions of the junctions of diodes $D_V$. This decrease in capacitance causes a corresponding increase in the resonant frequency of the VCO tank. Likewise, as the voltage $V_{tune}$ is decreased, the capacitance of varactor diodes $D_V$ increase due to the decreased width of the depletion regions of the junctions of diodes $D_V$. This increase in capacitance causes a corresponding decrease in the resonant frequency of the VCO tank. In alternative embodiments, the polarity of varactor diodes $D_V$ may be reversed such that the resonant frequency of the VCO tank decreases with increasing voltage.

Figure 3A:
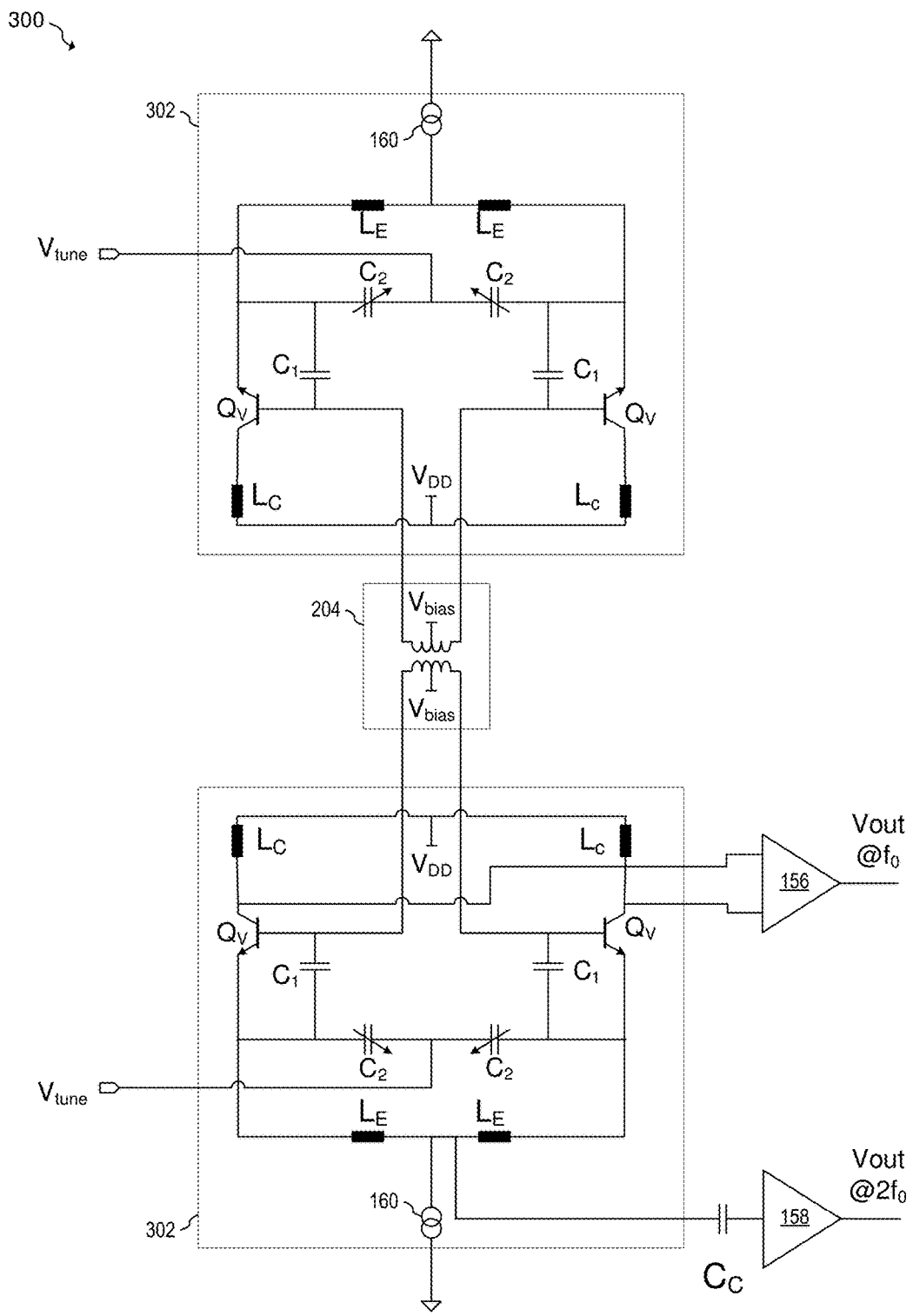
FIGS. 3A, 3B and 3C illustrate schematics of further embodiment dual-core Colpitts VCOs.
Figure 3B:
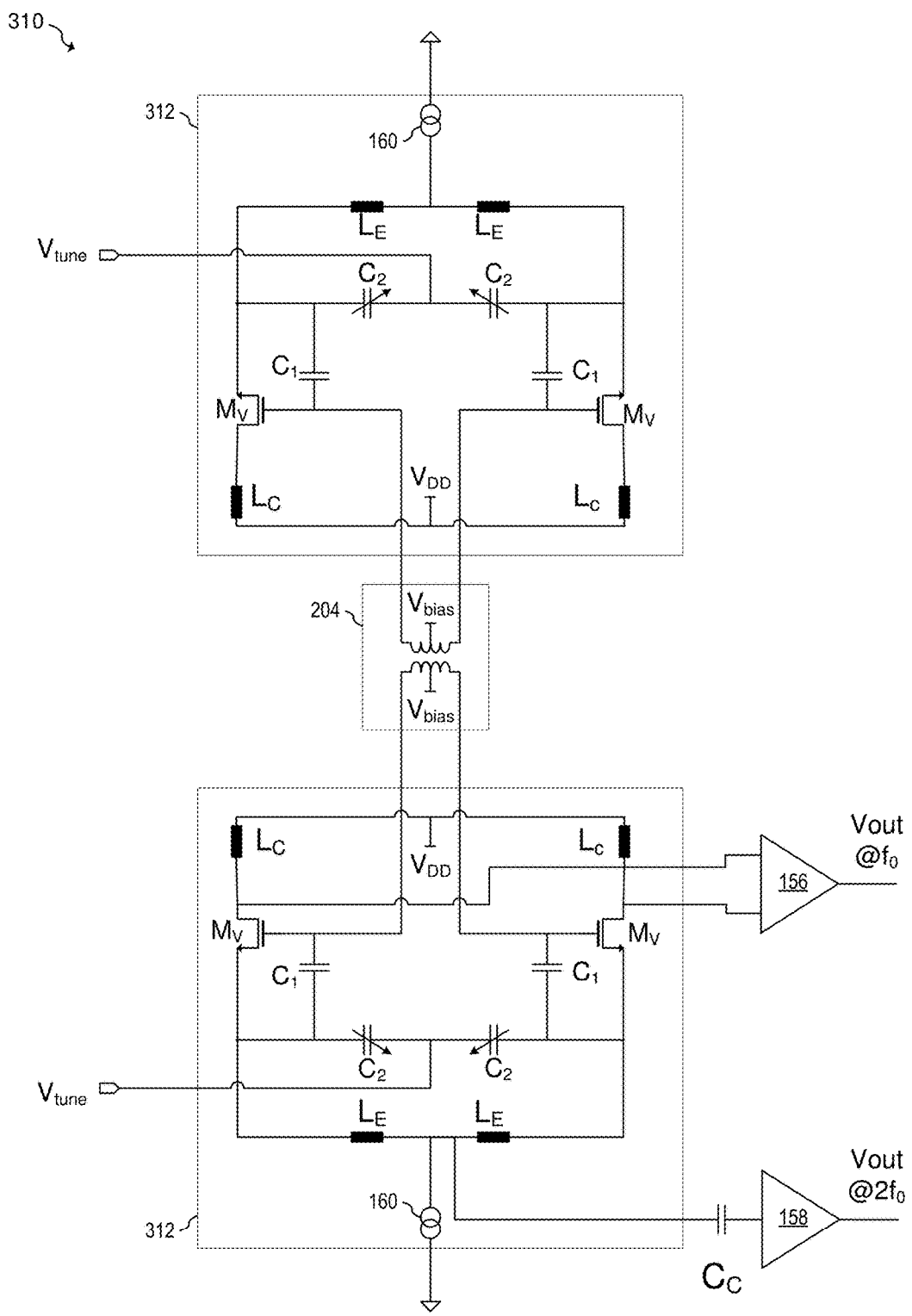
Figure 3C:
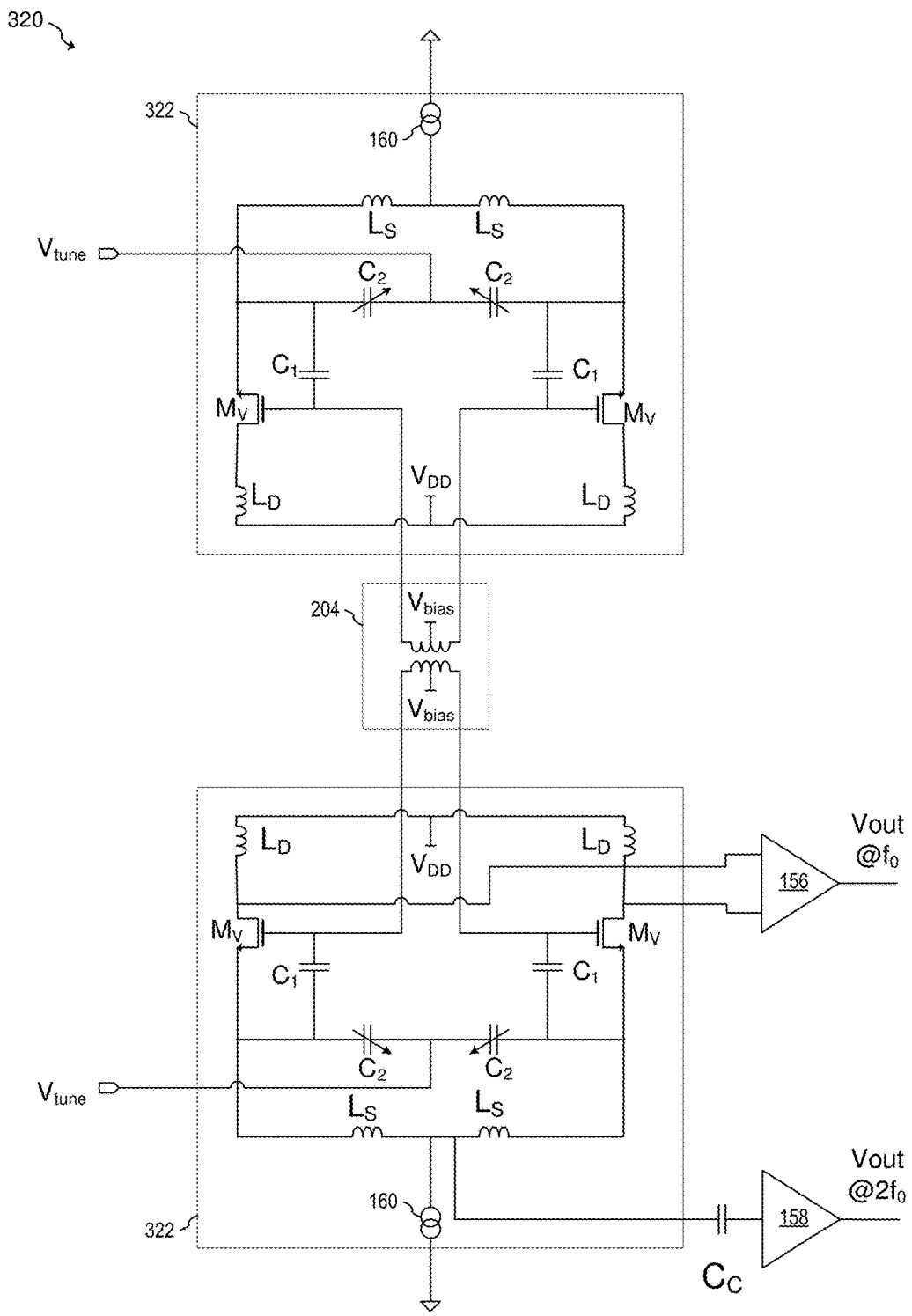

FIGS. 3A-3C illustrate various alternative embodiment Colpitts push-push VCOs. For example, FIG. 3A illustrates Colpitts push-push VCO 300 in accordance with another embodiment. VCO 300 is similar to VCO 200 illustrated in FIG. 2A, with the exception that inductors $L_E$ and load inductors $L_C$ of VCO core 302 are implemented using transmission line elements instead of traditional inductor circuit such as coils or spiral inductors. These transmission line elements may be implemented using microstrip structures and/or other transmission line structures known in the art. The transmission line elements used to implement inductors $L_E$ and load inductors $L_C$ may sized to produce an inductive impedance at the frequency oscillation of the VCO.

FIG. 3B illustrates Colpitts push-push VCO 310 in accordance with a further embodiment. VCO 310 is similar to VCO 300 illustrated in FIG. 3A, with the exception that VCO core 312 includes NMOS transistors $M_V$ instead of BJT transistors. In some embodiments, VCO 310 may be implemented using a fine geometry CMOS process. Embodiment CMOS Colpitts VCOs may also be implemented such as shown in FIG. 3C, which also illustrates a Colpitts push-push VCO 320 that is implemented using NMOS transistors $M_V$ in VCO core 322, but uses inductors (such as spiral inductors) for inductors $L_S$ and load inductors $L_D$.

Figure 4A:
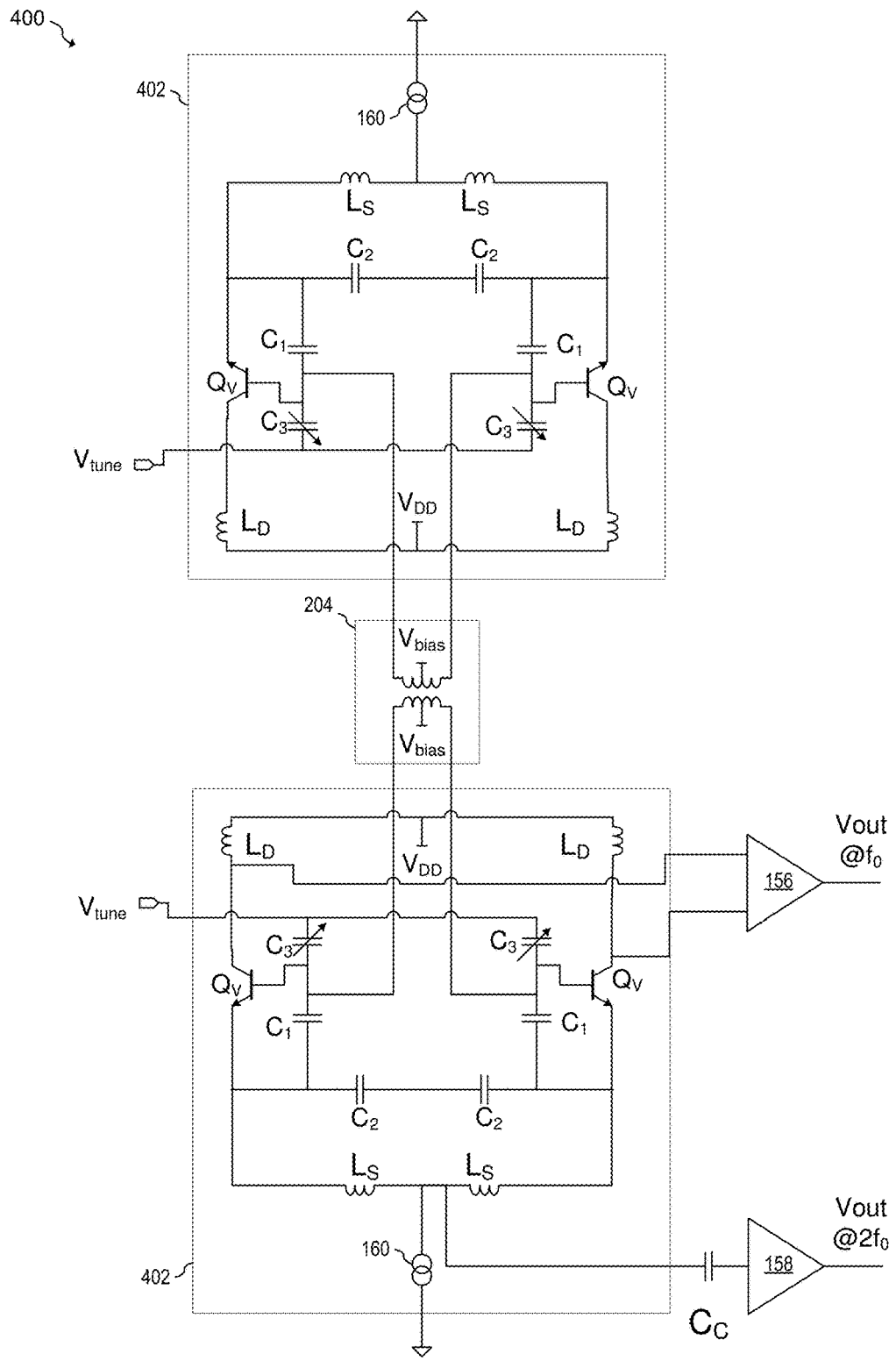
FIGS. 4A and 4B illustrate schematics of embodiment dual-core Clapp VCOs.
Figure 4B:
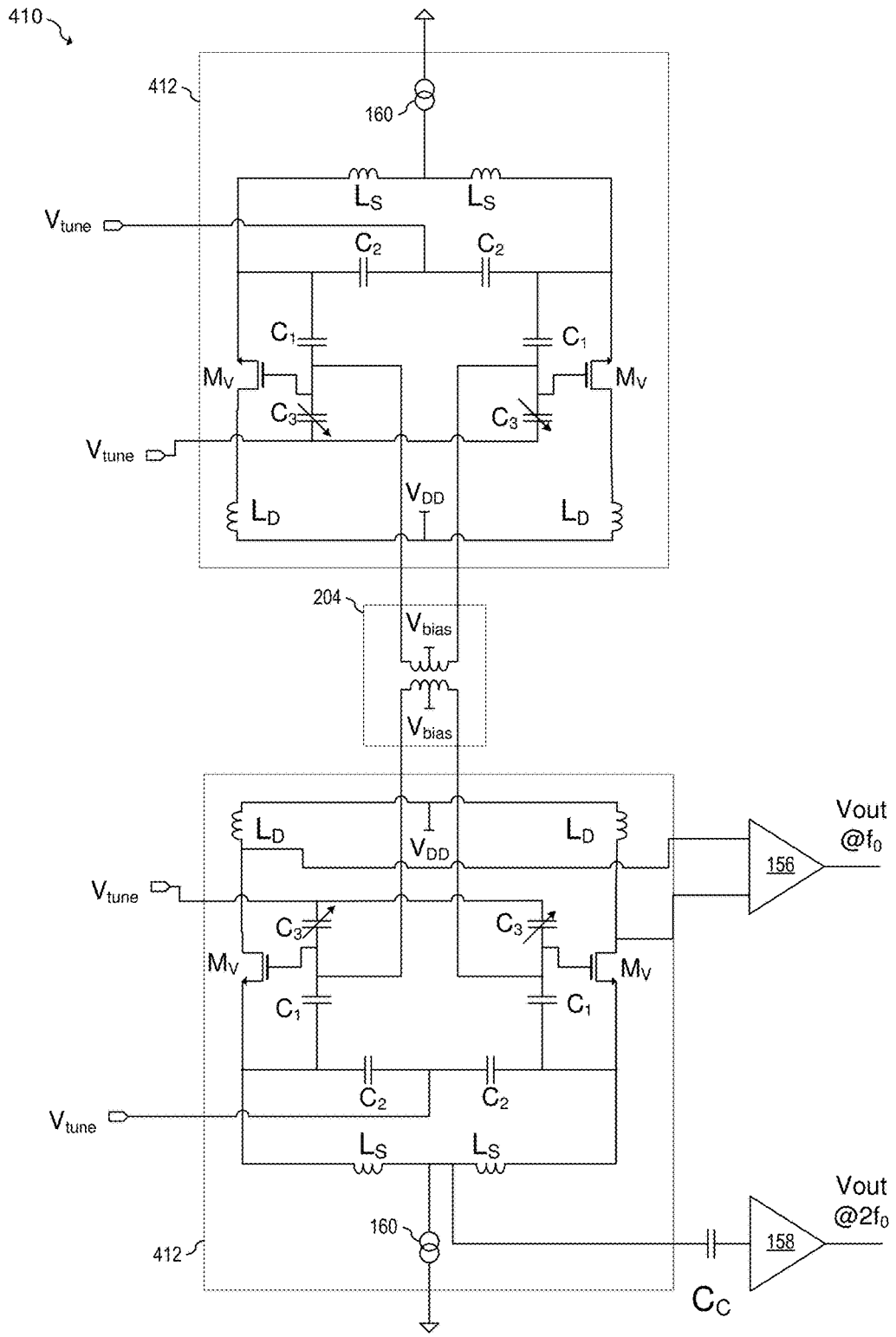

As mentioned above, embodiment coupled VCO techniques may also be applied to other VCO architectures besides Colpitts. For example, FIGS. 4A and 4B illustrate embodiment Clapp push-push VCO. The Clapp push-push VCO 400 shown in FIG. 4A is similar to Colpitts push-push VCO 200 shown in FIG. 2A with the exception that the tuning voltage is applied to a variable capacitors $C_3$ coupled between the tuning voltage terminal $V_{tune}$ and the bases of BJT transistors $Q_V$ instead of to capacitors $C_2$. As shown, Clapp push-push VCO 400 has two VCO cores 402 that each include a pair of BJT transistors $Q_V$, inductors $L_S$, capacitors $C_2$, load inductors $L_D$, and capacitors $C_1$ coupled between the bases of BJT transistors $Q_V$, and, tunable capacitors $C_3$ coupled between the bases of BJT transistors $Q_V$ and a tuning voltage terminal $V_{tune}$. In various embodiments, tunable capacitors $C_3$ may be implemented using varactor diodes or other tunable capacitor structures known in the art.

FIG. 4B illustrates Clapp push-push VCO 410 in which VCO core 412 is implemented using NMOS transistors instead of BJT transistors. It should be appreciated that inductances $L_s$ and load inductances $L_D$ are shown in FIGS. 4A and 4B as being implemented using inductors, these elements may also be implemented using transmission line elements in alternative embodiments.

Figure 5A:
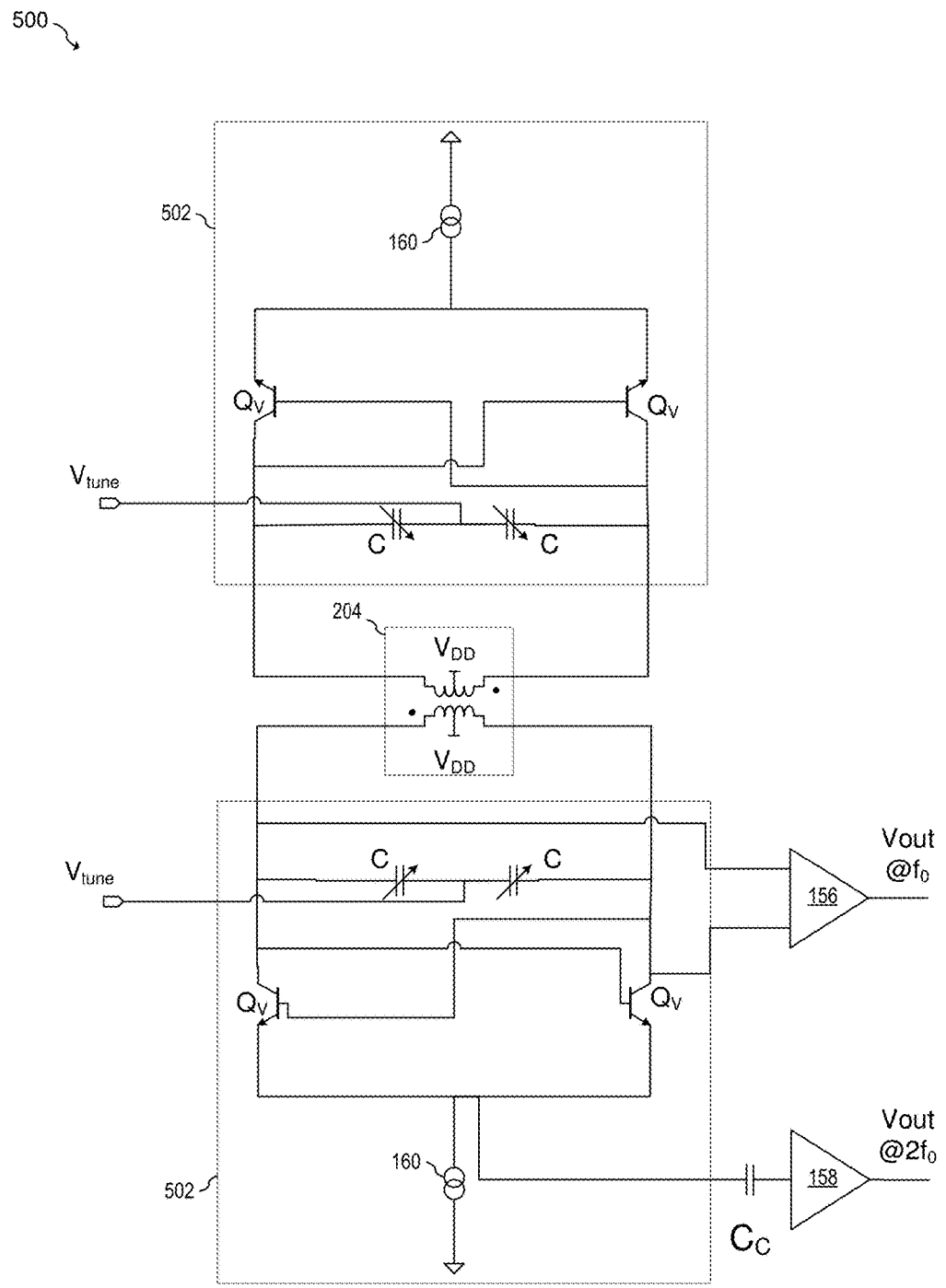
FIGS. 5A and 5B illustrate schematics of embodiment dual-core cross-coupled VCOs.
Figure 5B:
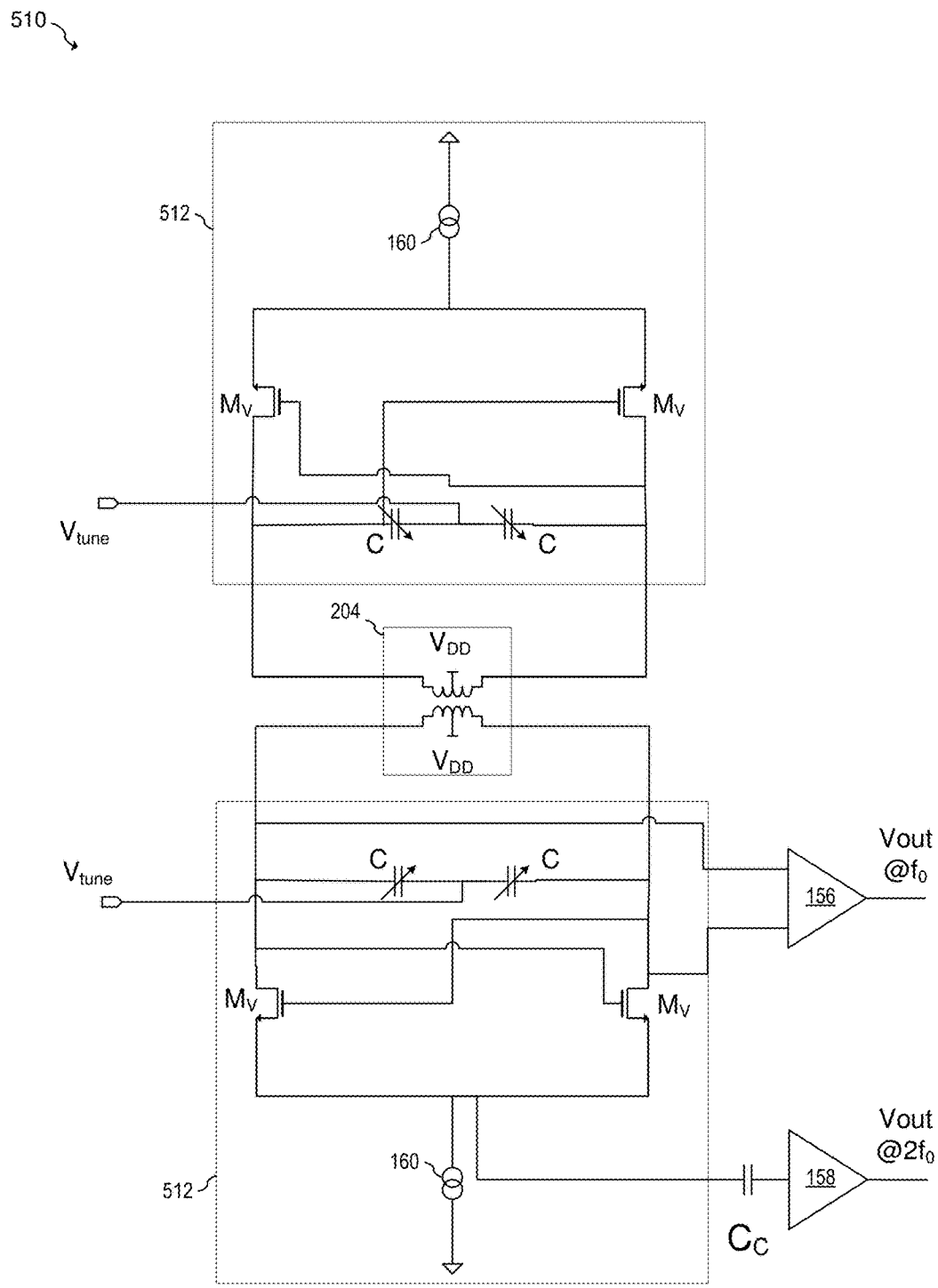

Embodiment coupling methods may also be applied to cross-coupled push-push VCOs, as shown in FIG. 5A, which illustrates a cross-coupled push-push VCO 500 according to a further embodiment of the present invention. As shown, VCO 500 includes two VCO cores 502 that are coupled together via transformer 204. Each VCO core 502 includes a cross-coupled pair of BJTs $Q_V$ in which the base of one transistor of the pair is coupled to the collector of the other transistor of the pair, and tunable capacitors C, which may be implemented using varactor diodes, are coupled between the collectors of transistors $Q_V$. Power is provided to each VCO via the windings of transformer 204. As shown, the center-tap of each winding is coupled to $V_{DD}$ and the each end of each winding is coupled to a collector of a respective transistor $Q_V$. In an embodiment, the each winding of transformer 204 also serves as the tank inductance, such that the frequency of oscillation of VCO 500 is determined by the capacitance of tunable capacitor C. the parasitic capacitance of transistors $Q_V$, and the inductance of the transformer winding. FIG. 5B illustrates cross-coupled push-push VCO 510 according to an alternative embodiment of the present invention. VCO 510 is similar to VCO 500 shown in FIG. 5A, with the exception that VCO cores 512 include a pair of NMOS devices $M_V$ instead of BJT devices. In further alternative embodiments, other device types besides BJT and NMOS devices, such as PMOS, HEMP and/or HBT devices, may be used for all embodiments disclosed above.

Figure 6A:
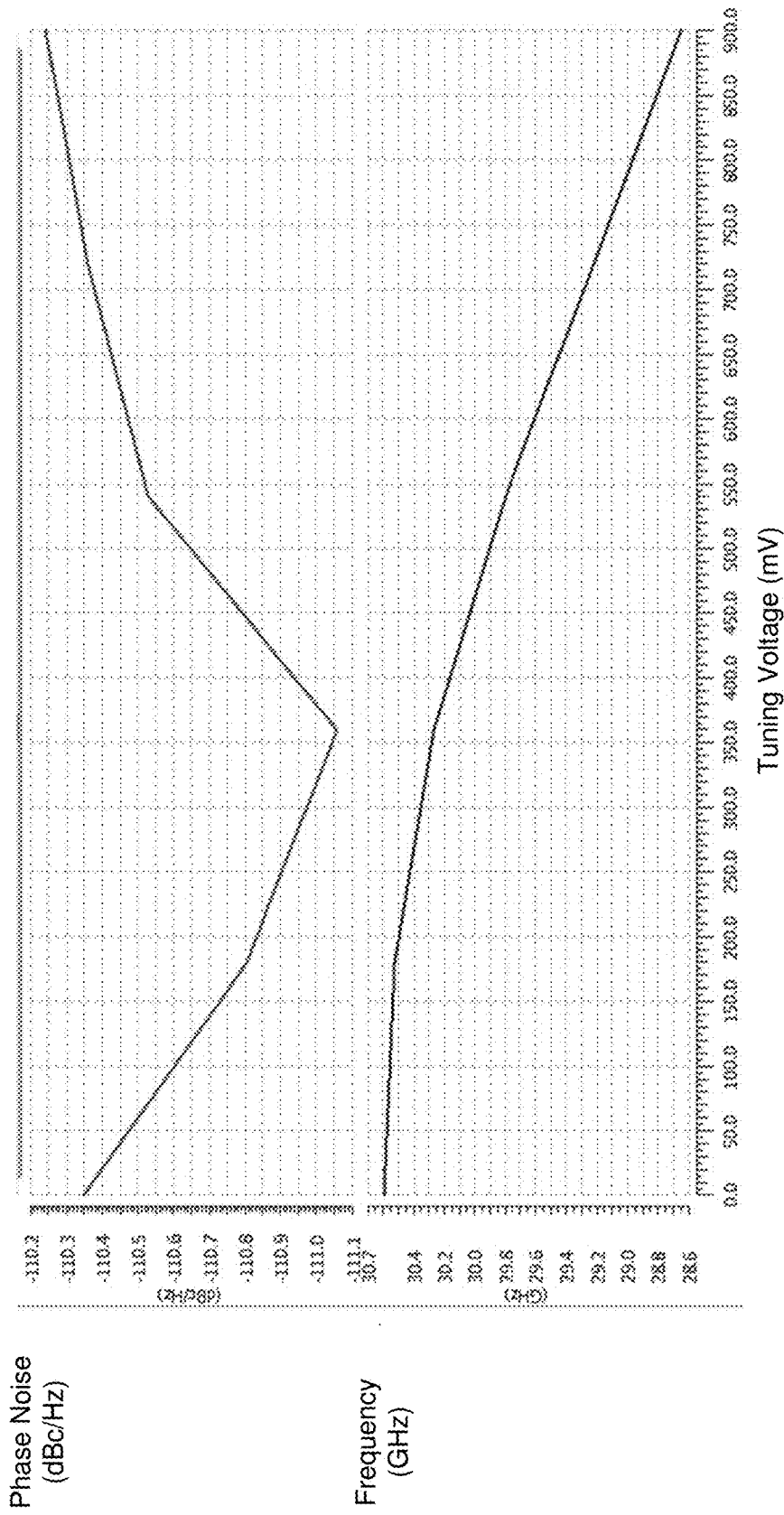
FIGS. 6A and 6B illustrate graphs showing the performance of embodiment dual-core Colpitts VCOs.

FIG. 6A illustrates graphs of simulated phase noise vs. tuning voltage and frequency vs. tuning voltage for the embodiment CMOS Colpitts VCO 320 shown in FIG. 3C and implemented in a 28 nm CMOS process. The VCO is configured to have a tank inductance of 400 pH with a Q of 2 at 30 GHz. The power supply voltage $V_{DD}$ is about 900 mV and the current consumption is 34 mA. As shown, the phase noise of VCO 310 remains less than −110 dBc/Hz at a 1 MHz offset for oscillation frequencies of between about 28.6 GHz and 30.6 GHz over a tuning voltage range of 900 mV. It should be appreciated that an output frequency of about 60 GHz may be provided from the same VCO by buffering the second harmonic of the frequency of oscillation via output buffer 158.

Figure 6B:
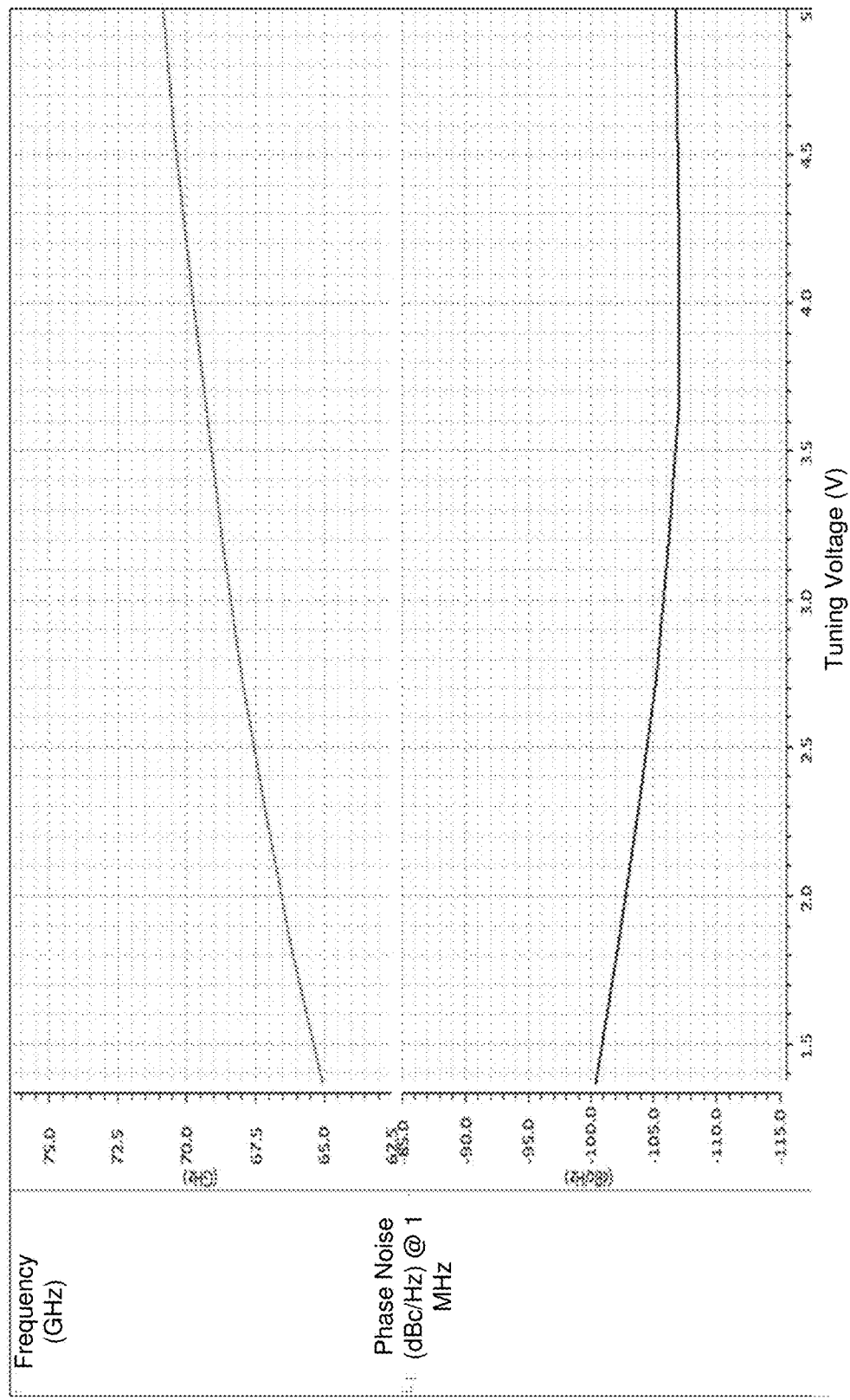

FIG. 6B illustrates graphs of simulated phase noise vs. tuning voltage and frequency vs. tuning voltage for the embodiment BJT Colpitts VCO 200 shown in FIG. 2A and implemented in a BiCMOS process. The VCO is configured to have a tank inductance of about 120 pH. The power supply voltage $V_{DD}$ is about 1.5 V and the current consumption is 58 mA. As shown, the phase noise of VCO 200 is about −107 dBc/Hz at a 1 MHz offset for an oscillation frequency of 70 GHz.

Figure 7:
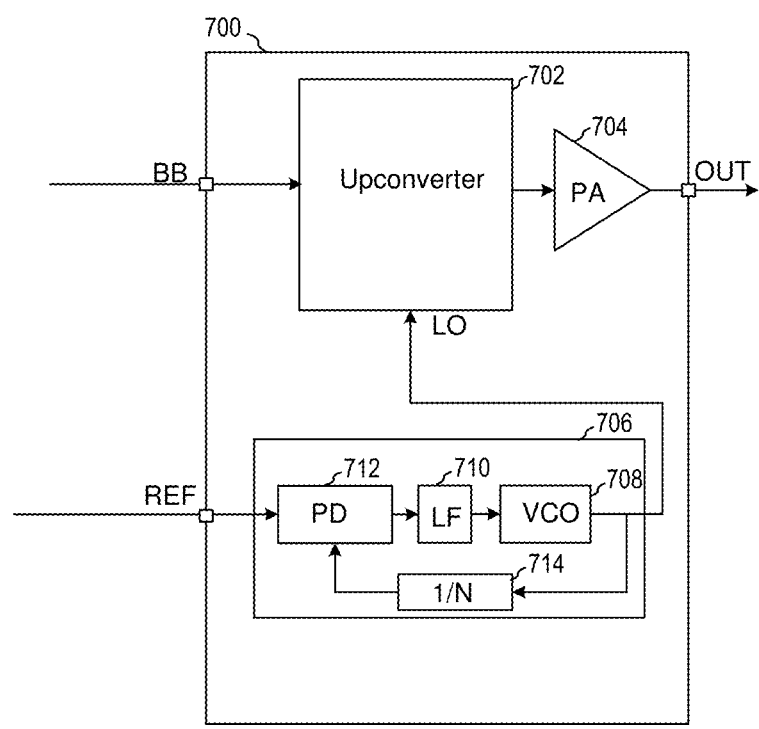
FIG. 7 illustrates an embodiment radar system that utilizes embodiment dual-core VCOs.

FIG. 7 illustrates single-chip radar transmitter system 700 that includes upconverter 702, power amplifier 704 and frequency generation circuit 706. As shown, upconverter 702 upconverts baseband signal BB to a higher frequency signal, which is then amplified by power amplifier 704 and output on pin OUT. In some embodiments, baseband signal BB may be a swept frequency or other signal type used in a radar system. Frequency generation circuit 706 produces local oscillator signal LO based on a reference frequency on pin REF that may be generated using, for example, a crystal oscillator. In an embodiment, frequency generation circuit 706 is implemented using a phase locked loop (PLL) having phase detector 712, loop filter 710, VCO 708 and divider

714. VCO 708 may be implemented using embodiment VCOs described herein. In some embodiments, the function of phase detector 712, loop filter 710 may be performed digitally using digital circuits and systems known in the art, as well as using analog circuitry. For example, these functions may be implemented using custom digital logic, standard cell digital logic, and/or may be implemented in software running on a processor, microcontroller or digital signal processor. Such processors may include, for example, a processor core, memory coupled to the processor core and one or more input/output ports. Alternatively, other circuits and systems known in the art may be used to implement these functions. It should be appreciated that system 700 is just one of many examples of embodiment systems that may utilize embodiment oscillators. Alternative systems may include, for example, wireless and wire line communication systems, and other systems that use VCOs.

Example embodiments of the present invention are summarized here. Other embodiments can also be understood from the entirety of the specification and the claims filed herein.

Example 1

A method of operating a voltage controlled oscillator (VCO) includes generating a first oscillating signal in a first VCO core and generating a second oscillating signal in a second VCO core, such that the first oscillating signal and the second oscillating signal have a same frequency and a fixed phase offset. The VCO includes the first VCO core and the second VCO core, and each VCO core includes a pair of transistors. The VCO also includes a transformer having a first winding coupled between control nodes of the pair of transistors of the first VCO core and a second winding coupled between control nodes of the pair of transistors of the second VCO core.

Example 2

The method of example 1, where the first VCO core and the second VCO core each comprises a Colpitts oscillator.

Example 3

The method of one of examples 1 and 2, further including buffering a fundamental frequency of the first oscillating signal from output nodes of the pair of transistors of the first VCO core or the second VCO core.

Example 4

The method of one of examples 1 to 3, further including buffering a second harmonic of the first oscillating signal from reference nodes of the pair of transistors of the first VCO core or the second VCO core.

Example 5

A voltage controlled oscillator including a first VCO core, a second VCO core and a transformer. Each VCO core includes a pair of transistors and a capacitance coupled between control nodes of the pair of transistors, and the transformer includes a first winding coupled between control nodes of the pair of transistors of the first VCO core and a second winding coupled between control nodes of the pair of transistors of the second VCO core. An inductance of the first winding forms a tank inductance of the first VCO core, and an inductance of the second winding forms a tank inductance of the second VCO core.

Example 6

The voltage controlled oscillator of claim 5, where the transformer includes a symmetrical transformer.

Example 7

The voltage controlled oscillator of one of examples 5 and 6, where the first VCO core, the second VCO core and the transformer are disposed on a same semiconductor substrate.

Example 8

The voltage controlled oscillator of one of examples 5 to 7, where the pairs of transistors of the first VCO core and the second VCO core includes bipolar junction transistors.

Example 9

The voltage controlled oscillator of one of examples 5 to 7, where the pairs of transistors of the first VCO core and the second VCO core comprise metal oxide semiconductor (MOS) transistors.

Example 10

The voltage controlled oscillator of one of examples 5 to 9, where the capacitance of the first VCO core and the capacitance of the second VCO core each comprises a varactor.

Example 11

The voltage controlled oscillator of one of examples claim 5 to 9, where the first VCO core and the second VCO core each comprises a pair of varactors coupled to respective control nodes of the pair of transistors.

Example 12

An integrated circuit including a semiconductor substrate, a first VCO core, a second VCO core, and a transformer. The first VCO core is disposed on the semiconductor substrate and includes a first transistor, a second transistor, a first capacitor coupled between a reference node of the first transistor and a reference node of the second transistor, a second capacitor coupled between a control node of the first transistor and the reference node of the first transistor, and a third capacitor coupled between a control node of the second transistor and the reference node of the second transistor; the second VCO core is disposed on the semiconductor substrate and includes a third transistor, a fourth transistor, a fourth capacitor coupled between a reference node of the third transistor and a reference node of the fourth transistor, a fifth capacitor coupled between a control node of the third transistor and the reference node of the third transistor, and a sixth capacitor coupled between a control node of the second transistor and the reference node of the second transistor; and the transformer is disposed on the semiconductor substrate and includes a first winding coupled between the control node of the first transistor and the control node of the second transistor, and a second winding coupled between the control node of the third transistor and the control node of the fourth transistor, wherein the first winding is magnetically coupled to the second winding, wherein the first VCO core, the second VCO core and the transformer form a voltage controlled oscillator.

Example 13

The integrated circuit of example 12, where the transformer includes a symmetrical transformer.

Example 14

The integrated circuit of one of examples 12 and 13, where: the first winding of the transformer includes a first loop connected between a first connection of the first winding and a second connection of the first winding, and a first center tap connection connected at a center tap of the first winding, where the first connection and the second connection are disposed on a first side of the first loop and the first center tap connection is disposed on a second side of the first loop opposite the first side; and the second winding of the transformer includes a second loop connected between a third connection of the second winding and a fourth connection of the second winding, and a second center tap connection connected at a center tap of the second winding, where the third connection and the fourth connection are disposed on the second side of the second loop and the second center tap connection is disposed on the first side of the second loop, the first center tap connection is disposed between the third connection and the fourth connection, the second center tap connection is disposed between the first connection and the second connection, and the first winding is the same size as the second winding.

Example 15

The integrated circuit of one of examples 12 to 14, where the first transistor, the second transistor, the third transistor and the fourth transistor are bipolar junction transistors.

Example 16

The integrated circuit of one of examples 12 to 14, where the first transistor, the second transistor, the third transistor and the fourth transistor are metal oxide semiconductor (MOS) transistors.

Example 17

The integrated circuit of one of examples 12 to 16, further including a first buffer coupled to output nodes of the first transistor and the second transistor of the first VCO core, where the first buffer configured to output a fundamental frequency of the voltage controlled oscillator.

Example 18

The integrated circuit of one of examples 12 to 17, further including a second buffer coupled to reference nodes of the first transistor and the second transistor of the first VCO core, where the second buffer configured to output twice fundamental frequency of the voltage controlled oscillator.

Example 19

The integrated circuit of one of examples 12 to 18, where the first capacitor and the fourth capacitor each comprises at least one varactor.

Example 20

The integrated circuit of one of examples 12 to 18, further including: a first varactor coupled between the control node of the first transistor and a first tuning node; a second varactor coupled between the control node of the second transistor and the first tuning node; a third varactor coupled between the control node of the third transistor and a second tuning node; and a fourth varactor coupled between the control node of the fourth transistor and the second tuning node.

Advantages of embodiments include the ability to couple two Colpitts oscillators together to achieve a low phase noise.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a voltage controlled oscillator (VCO) comprising a first VCO core and a second VCO core that each includes a pair of transistors, and a transformer having a first winding coupled between control nodes of the pair of transistors of the first VCO core and a second winding coupled between control nodes of the pair of transistors of the second VCO core, wherein load path terminals of the pair of transistors of the first VCO core and load path terminals of the pair of transistors of the second VCO core are not directly coupled to each other, are not directly coupled to the first winding of the transformer, and are not directly coupled to the second winding of the transformer, the method comprising:
  generating a first oscillating signal in the first VCO core; and
  generating a second oscillating signal in the second VCO core, wherein the first oscillating signal and the second oscillating signal have a same frequency and a fixed phase offset.

2. The method of claim 1, wherein the first VCO core and the second VCO core each comprises a Colpitts oscillator.

3. The method of claim 1, further comprising buffering a fundamental frequency of the first oscillating signal from output nodes of the pair of transistors of the first VCO core or the second VCO core.

4. The method of claim 1, further comprising buffering a second harmonic of the first oscillating signal from reference nodes of the pair of transistors of the first VCO core or the second VCO core.

5. A voltage controlled oscillator (VCO) comprising:
  a first VCO core and a second VCO core, each VCO core including a pair of transistors and a capacitance coupled between control nodes of the pair of transistors; and
  a transformer comprising
    a first winding coupled between control nodes of the pair of transistors of the first VCO core, wherein an inductance of the first winding forms a tank inductance of the first VCO core, and
    a second winding coupled between control nodes of the pair of transistors of the second VCO core, wherein an inductance of the second winding forms a tank inductance of the second VCO core, wherein load path terminals of the pair of transistors of the first VCO core and load path terminals of the pair of transistors of the second VCO core are not directly coupled to each other, are not directly coupled to the first winding of the transformer, and are not directly coupled to the second winding of the transformer.

6. The voltage controlled oscillator of claim 5, wherein the transformer comprises a symmetrical transformer.

7. The voltage controlled oscillator of claim 5, wherein the first VCO core, the second VCO core and the transformer are disposed on a same semiconductor substrate.

8. The voltage controlled oscillator of claim 5, wherein the pairs of transistors of the first VCO core and the second VCO core comprise bipolar junction transistors.

9. The voltage controlled oscillator of claim 5, wherein the pairs of transistors of the first VCO core and the second VCO core comprise metal oxide semiconductor (MOS) transistors.

10. The voltage controlled oscillator of claim 5, wherein the capacitance of the first VCO core and the capacitance of the second VCO core each comprises a varactor.

11. The voltage controlled oscillator of claim 5, wherein the first VCO core and the second VCO core each comprises a pair of varactors coupled to respective control nodes of the pair of transistors.

12. An integrated circuit comprising:
a semiconductor substrate;
a first voltage controlled oscillator (VCO) core disposed on the semiconductor substrate, the first VCO core comprising a first transistor, a second transistor, a first capacitor coupled between a reference node of the first transistor and a reference node of the second transistor, a second capacitor coupled between a control node of the first transistor and the reference node of the first transistor, and a third capacitor coupled between a control node of the second transistor and the reference node of the second transistor; and
a second VCO core disposed on the semiconductor substrate, the second VCO core comprising a third transistor, a fourth transistor, a fourth capacitor coupled between a reference node of the third transistor and a reference node of the fourth transistor, a fifth capacitor coupled between a control node of the third transistor and the reference node of the third transistor, and a sixth capacitor coupled between a control node of the second transistor and the reference node of the second transistor; and
a transformer disposed on the semiconductor substrate, the transformer comprising a first winding coupled between the control node of the first transistor and the control node of the second transistor, and a second winding coupled between the control node of the third transistor and the control node of the fourth transistor, wherein the first winding is magnetically coupled to the second winding, wherein the first VCO core, the second VCO core and the transformer form a voltage controlled oscillator, output terminals and reference nodes of the first transistor, second transistor, third transistor and fourth transistor are not directly coupled to each other, are not directly coupled to the first winding of the transformer and are not directly coupled to second winding of the transformer.

13. The integrated circuit of claim 12, wherein the transformer comprises a symmetrical transformer.

14. The integrated circuit of claim 13, wherein:
the first winding of the transformer comprises a first loop connected between a first connection of the first winding and a second connection of the first winding, and a first center tap connection connected at a center tap of the first winding, wherein the first connection and the second connection are disposed on a first side of the first loop and the first center tap connection is disposed on a second side of the first loop opposite the first side; and
the second winding of the transformer comprises a second loop connected between a third connection of the second winding and a fourth connection of the second winding, and a second center tap connection connected at a center tap of the second winding, wherein the third connection and the fourth connection are disposed on the second side of the second loop and the second center tap connection is disposed on the first side of the second loop, the first center tap connection is disposed between the third connection and the fourth connection, the second center tap connection is disposed between the first connection and the second connection, and the first winding is the same size as the second winding.

15. The integrated circuit of claim 12, wherein the first transistor, the second transistor, the third transistor and the fourth transistor are bipolar junction transistors.

16. The integrated circuit of claim 12, wherein the first transistor, the second transistor, the third transistor and the fourth transistor are metal oxide semiconductor (MOS) transistors.

17. The integrated circuit of claim 12, further comprising a first buffer coupled to output nodes of the first transistor and the second transistor of the first VCO core, the first buffer configured to output a fundamental frequency of the voltage controlled oscillator.

18. The integrated circuit of claim 12, further comprising a second buffer coupled to reference nodes of the first transistor and the second transistor of the first VCO core, the second buffer configured to output twice fundamental frequency of the voltage controlled oscillator.

19. The integrated circuit of claim 12, wherein the first capacitor and the fourth capacitor each comprises at least one varactor.

20. The integrated circuit of claim 12, further comprising:
a first varactor coupled between the control node of the first transistor and a first tuning node;
a second varactor coupled between the control node of the second transistor and the first tuning node;
a third varactor coupled between the control node of the third transistor and a second tuning node; and
a fourth varactor coupled between the control node of the fourth transistor and the second tuning node.

* * * * *